(12) United States Patent
Hori

(10) Patent No.: US 8,822,836 B2
(45) Date of Patent: Sep. 2, 2014

(54) BONDING SHEET, ELECTRONIC CIRCUIT DEVICE AND ITS MANUFACTURING METHOD

(75) Inventor: Eiji Hori, Tokyo (JP)

(73) Assignee: NEC Corporation, Tokyo (JP)

( * ) Notice: Subject to any disclaimer, the term of this patent is extended or adjusted under 35 U.S.C. 154(b) by 476 days.

(21) Appl. No.: 12/556,061

(22) Filed: Sep. 9, 2009

(65) Prior Publication Data

US 2010/0071945 A1    Mar. 25, 2010

(30) Foreign Application Priority Data

Sep. 19, 2008    (JP) .................................. 2008-241045

(51) Int. Cl.
*H05K 1/16*    (2006.01)
*H05K 3/32*    (2006.01)

(52) U.S. Cl.
CPC ...... *H05K 3/321* (2013.01); *H05K 2201/10378* (2013.01); *H05K 2201/0133* (2013.01); *H05K 2201/10734* (2013.01); *H05K 2201/10674* (2013.01); *H05K 2203/1189* (2013.01)
USPC .......................................... 174/260; 174/259

(58) Field of Classification Search
CPC ............ H01L 2224/15; H01L 2224/16; H01L 2224/161; H01L 2224/16111; H05K 1/183; H05K 1/184; H05K 3/107; H05K 3/32; H05K 3/321; H05K 3/4007
USPC ......... 174/260, 250, 252, 255, 261–266, 256, 174/258, 259
See application file for complete search history.

(56) References Cited

U.S. PATENT DOCUMENTS

| | | | | |
|---|---|---|---|---|
| 6,057,513 A | * | 5/2000 | Ushikoshi et al. ............ | 174/260 |
| 6,759,596 B1 | * | 7/2004 | Shelnut et al. ................ | 174/255 |
| 2003/0116349 A1 | * | 6/2003 | Hashimoto .................... | 174/260 |
| 2008/0289868 A1 | * | 11/2008 | Nakamura et al. ............ | 174/260 |

FOREIGN PATENT DOCUMENTS

| | | |
|---|---|---|
| JP | 2001189337 A | 7/2001 |
| JP | 3549017 B | 4/2004 |
| JP | 2006032632 A | 2/2006 |

OTHER PUBLICATIONS

Machine Translation of JP 2006-032632 (Date of Publication: Feb. 2, 2006).*

* cited by examiner

*Primary Examiner* — Tremesha S Willis
(74) *Attorney, Agent, or Firm* — Sughrue Mion, PLLC

(57) ABSTRACT

A bonding sheet includes an insulating sheet with cavities formed within the insulating sheet, and adhesive-filling portions made of an electrically conductive adhesive filled in the cavities. An electronic circuit device includes an IC package mounted on a circuit board, with the bonding sheet disposed between the IC package and the circuit board. The IC package is provided with terminal electrodes in the lower surface, and electrode bumps project from the terminal electrodes. The circuit board has recesses in the upper surface, and electrode pads are formed on the bottom of the recesses. The electrically conductive adhesive that flows out from the adhesive-filling portions filled the recesses and fix the electrode bumps and the electrode pads.

15 Claims, 3 Drawing Sheets

PORTION B

AA CROSS SECTION

PORTION B

BONDING SHEET, ELECTRONIC CIRCUIT DEVICE AND ITS MANUFACTURING METHOD

INCORPORATION BY REFERENCE

This application is based on Japanese Patent Application No. 2008-241045 filed on Sep. 19, 2008 and including specification, claims, drawings and summary. The disclosure of the above Japanese Patent Application is incorporated herein by reference in its entirety.

TECHNICAL FIELD

The present invention relates to a bonding sheet, and more particularly, a bonding sheet to be disposed between an electronic component and a circuit board, via the bonding sheet the electronic component can be fixed on the circuit board and via the bonding sheet terminal electrodes of the electronic component can be electrically connected to respective electrode pads of the circuit board, an electronic circuit device using the bonding sheet, and a method of manufacturing the electronic circuit device.

BACKGROUND ART

Electronic components, for example, IC packages are fixed on a circuit board via solder and connected to a circuit formed on the circuit board via solder (hereinafter, a term "mount" will be used to mean "to fix" and "to electrically connect"). Solder mounting involves melting solder at a high temperature, which gives a thermal load to an electronic component and might damage the electronic component in the worst case. Particularly, lead-free solder, which is used lately, has a higher melting point and thus a higher probability of thermally damaging an electronic component.

Hence, various |mounting|[A1]methods for avoiding exposure of an electronic component to a high temperature have been proposed, which use an electrically conductive adhesive instead of solder.

Unexamined Japanese Patent Application KOKAI Publication No. 2001-189337 discloses an electronic circuit device, in which an IC package is mounted on the electrode pads on a circuit board by transferring an electrically conductive adhesive to electrode bumps, where the electrode bumps are projection portions formed on the terminal electrodes of the IC package. Each electrode bump is formed of a lower bump to be fixed to the terminal electrode and an upper bump stacked on the lower bump. The upper bump has a compressive elastic modulus smaller than that of the lower bump. This allows the upper bump to compressively deform to absorb any unevenness of the circuit board in its flatness or any unevenness among electrode pads in their thickness, keeping the IC package in fine connection.

However, because of the fluidity of the electrically conductive adhesive before it has hardened, the electrically conductive adhesive that exists between the IC package and the circuit board under the pressure applied by the IC package with its own weight, spreads and comes into contact with adjoining electrode pads, risking formation of a short circuit.

Hence, Japanese Patent Publication No. 3549017 discloses an electronic circuit device, in which each of the electrode pads on a circuit board has a recess. The method of this electronic circuit device can prevent an electrically conductive adhesive from spreading over the circuit board, because the electrically conductive adhesive will be trapped in the recesses of the electrode pads.

In this case, however, there still remains difficulty with appropriately controlling the volume of the electrically conductive adhesive to be transferred to the electrode bumps; if the volume of the electrically conductive adhesive transferred to the electrode bumps is inappropriate, even the method of the electronic circuit device described above will cause the electrically conductive adhesive to overflow from the electrode pads.

Unexamined Japanese Patent Application KOKAI Publication No. 2006-32632 discloses an electronic circuit device, in which an IC package has a recess on the circumference of each of its electrode bumps, while a circuit board is covered with a resin sheet, from which an electrically conductive adhesive partially protrudes.

Admittedly, the method of the electronic circuit device of Unexamined Japanese Patent Application KOKAI Publication No. 2006-32632 can securely prevent an overflow of the electrically conductive adhesive, because the electrically conductive adhesive will be trapped in the recesses formed on the circumference of the electrode bumps of the IC package. However, this method is not practical because it takes complication in manufacturing the IC package and the circuit board.

SUMMARY

The present invention was made in view of the above circumstances, and an exemplary object of the present invention is to provide a bonding sheet via which an electronic component can be mounted on a circuit board with a simple process, and an electronic device using the bonding sheet which can securely prevent a short circuit from being formed between electrode pads, and a method of manufacturing the electronic circuit device.

A bonding sheet according to an exemplary aspect of the present invention is a bonding sheet, being to be disposed between an electronic component and a circuit board, for fixing the electronic component on the circuit board via the bonding sheet, and for electrically connecting terminal electrodes of the electronic component to respective electrode pads of the circuit board via the bonding sheet, the bonding sheet, and which includes an insulating sheet with independently sealed cavities to be faced with the respective terminal electrodes of the electronic component, and adhesive-filling portions made of electrically conductive adhesive which fills the respective cavities.

An electronic circuit device according to another exemplary aspect of the present invention is an electronic circuit device including an electronic component, a circuit board and the bonding sheet, which is disposed between the electronic component and the circuit board, where the electronic component is fixed on the circuit board via the bonding sheet, and the terminal electrodes of the electronic component is electrically connected to respective electrode pads of the circuit board via the bonding sheet, where each of the terminal electrodes of the electronic component includes an electrode bumps, the electrode bumps pass through the bonding sheet from one surface to other surface thereof via the respective adhesive-filling portion and protrudes from the other surface of the bonding sheet, and the electrode bumps and the respective electrode pads are electrically connected with the electrically conductive adhesive that flows out from the respective adhesive-filling portions.

A method of manufacturing an electronic circuit device according to another exemplary aspect of the present invention is a method of manufacturing an electronic circuit device including an electronic component, a circuit board and the bonding sheet according to claim 1, which is disposed between the electronic component and the circuit board, the electronic component being fixed on the circuit board via the bonding sheet, and terminal electrodes of the electronic component being electrically connected to respective electrode pads of the circuit board via the bonding sheet, and includes: placing the bonding sheet on the circuit board as aligning the adhesive-filling portions of the bonding sheet to face the respective electrode pads in the circuit board; placing the electronic component on the bonding sheet as aligning the terminal electrodes of the electronic component to face the respective adhesive-filling portions of the bonding sheet; electrically connecting the terminal electrodes and the respective electrode pads via the electrically conductive adhesive that flows out from the respective adhesive-filling portions by the terminal electrodes passing through the bonding sheet to tear the respective adhesive-filling portions; and fixing the terminal electrodes and the respective electrode pads by solidifying the flowed electrically conductive adhesive.

A bonding sheet according to another exemplary aspect of the present invention is a bonding sheet, being to be disposed between an electronic component and a circuit board, for fixing the electronic component on the circuit board via the bonding sheet, and for electrically connecting terminal electrodes of the electronic component to respective electrode pads of the circuit board via the bonding sheet, the bonding sheet, and which includes an insulating sheet means having a plurality of cavity means for facing the respective terminal electrodes of the electronic component, and adhesive means made of electrically conductive adhesive for filling the respective encompassing means.

An electronic circuit device according to another exemplary aspect of the present invention is an electronic circuit device including an electronic component, a circuit board and the bonding sheet, which is disposed between the electronic component and the circuit board, where the electronic component is fixed on the circuit board via the bonding sheet, and the terminal electrodes of the electronic component is electrically connected to respective electrode pads of the circuit board via the bonding sheet, where each of the terminal electrodes of the electronic component includes an electrode bump, the electrode bumps pass through the bonding sheet from one surface to other surface thereof via the respective adhesive means and protrudes from the other surface of the bonding sheet, and the electrode bumps and the respective electrode pads are electrically connected with the electrically conductive adhesive that flows out from the respective adhesive means.

In accordance with the present inventions, it is possible to mount an electronic component on a circuit board with a simple process, and/or securely prevent formation of a short circuit between electrode pads.

BRIEF DESCRIPTION OF THE DRAWINGS

These objects and other objects and advantages of the present invention will become more apparent upon reading of the following detailed description and the accompanying drawings in which:

FIG. 1A is a perspective view showing the structure of a bonding sheet 20 according to an embodiment of the present invention, FIG. 1B is a top view showing the structure of the bonding sheet 20 according to an embodiment of the present invention, and FIG. 1C is a transverse cross section showing the structure of the bonding sheet 20 according to an embodiment of the present invention.

FIG. 2A is a transverse cross section of the electronic circuit device 30, FIG. 2B is a cross section taken along a line A-A of FIG. 2A, and FIG. 2C is an enlarged view of a portion B of FIG. 2A.

EXEMPLARY EMBODIMENT

The best mode for carrying out the present invention will be explained below with reference to the drawings.
[Bonding Sheet]

Figure 1A:
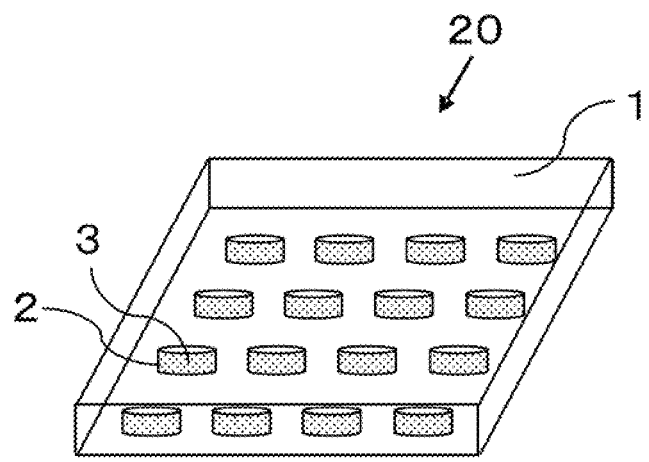
FIGS. 1A to 1C show the configuration of a bonding sheet according to the present invention, where
Figure 1B:
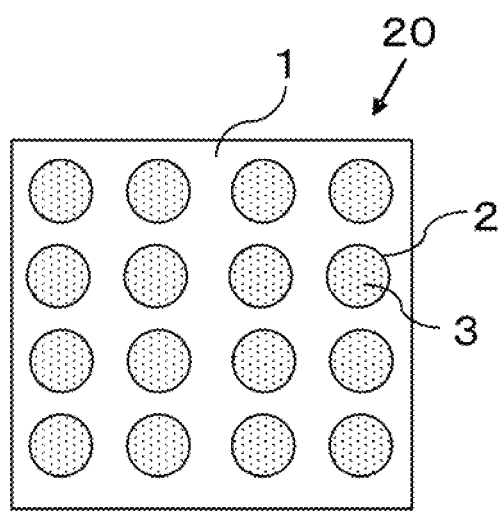
Figure 1C:
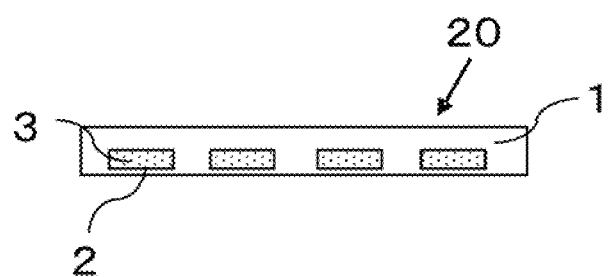

As shown in FIGS. 1A to 1C, a bonding sheet 20 according to an embodiment of the present invention comprises an insulating sheet 1 with cavities formed within the insulating sheet 1, and adhesive-filling portions 2 made of an electrically conductive adhesive 3 filled in the cavities.

The material of the insulating sheet 1 may preferably be an elastic insulating material, and may be selected from, for example, various synthetic rubbers including polybutadiene series rubbers, butadiene-acrylonitrile series rubbers and chloroprene series rubbers, a fluoro-rubber made of a fluorine resin, a silicone rubber made of a silicone resin, etc.

The electrically conductive adhesive 3 is a mixture of an adhesive resin contributing to adhesive bonding and conducting particles contributing to electric continuity. The adhesive resin may be selected from thermosetting resins such as a phenol resin, a polyimide resin, a melamine resin, a urea resin, etc., or thermoplastic resins such as a styrene resin, an acrylic resin, an EVA resin, which is a random copolymer of ethylene and vinyl acetate, etc. The conducting particles may be Ag, Pd, Ni, Au, Cu, C, Pt, Fe, Ti, etc.

The bonding sheet 20 may be manufactured in a manner that recesses are formed in a sheet-like substrate at predetermined positions, the electrically conductive adhesive 3 is dripped into the recesses, and the upper surface of the substrate is covered with a cover sheet such that the recesses are closed up.

The means of forming the recesses in the substrate is not limited; it may be molding, or irradiation of a flat sheet with electron beam.
[Electronic Circuit Device]

Figure 2A:
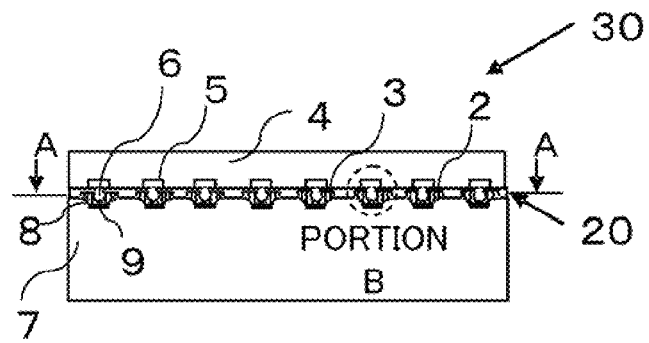
FIGS. 2A to 2C are diagrams explaining the configuration of an electronic circuit device 30 using die bonding sheet 20, where
Figure 2B:
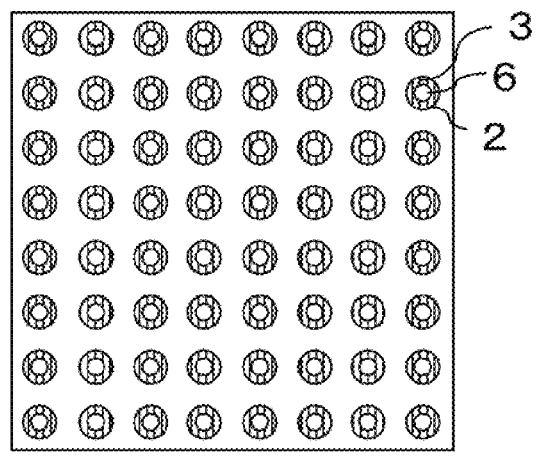

An electronic circuit device 30 is formed when an IC package 4 is mounted on a circuit board 7 as shown in FIG. 2A. In the electronic circuit device 30, the bonding sheet 20 is disposed between the IC package 4 and the circuit board 7. The IC package 4 is provided with terminal electrodes 5 in the lower surface thereof, and the terminal electrodes 5 project electrode bumps 6 therefrom. The circuit board 7 has recesses 8 in the upper surface thereof, and electrode pads 9 are formed on the bottom of the recesses 8.

The electrode bumps 6 are let into the bonding sheet 20 from the upper surface of the bonding sheet 20, go through the adhesive-filling portions 2, and tear the lower surface of the bonding sheet 20 to reach inside of the recesses 8. The electrically conductive adhesive 3 in the adhesive-filling portions 2 flows out into the recesses 8 through the openings in the bonding sheet 20 torn open by the electrode bumps 6, and then hardens in the state of filling the inner space of the recesses 8, i.e., the gap between the electrode bumps 6 and the electrode pads 9.

Figure 2C:
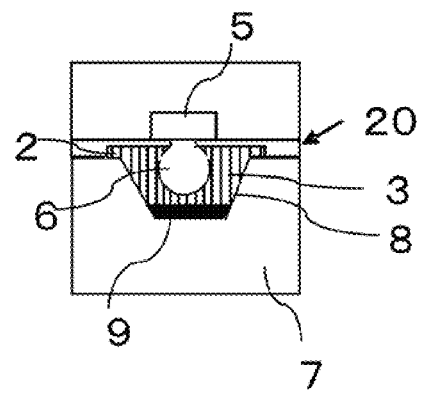

As shown in FIG. 2C, the electrically conductive adhesive 3 that has hardened inside the recesses 8 fixes the electrode bumps 6 inside the recesses 8 to bond the IC package 4 and the circuit board 7 together and electrically connect the terminal electrodes 5 and the electrode pads 9. In this way, the IC package 4 is mounted on the circuit board 7.

The cubic capacity of each adhesive-filling portion 2 should be smaller than the difference of subtracting the cubic measure of the electrode bump 6 from the cubic capacity of the recess 8, lest the electrically conductive adhesive 3 that has flowed into the recess 8 should overflow from the recess 8.

[Method of Manufacturing Electronic Circuit Device]

Next, a method of manufacturing the electronic circuit device 30 will be explained with reference to FIGS. 3A TO 3D.

Figure 3A:
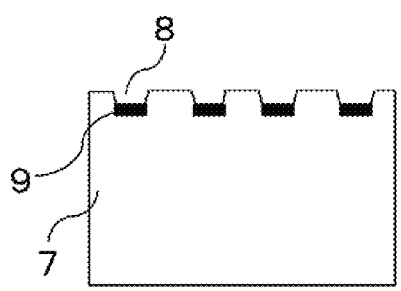
FIGS. 3A to 3D are exemplary diagrams explaining a method of manufacturing an electronic circuit device according to the present invention.
Figure 3B:
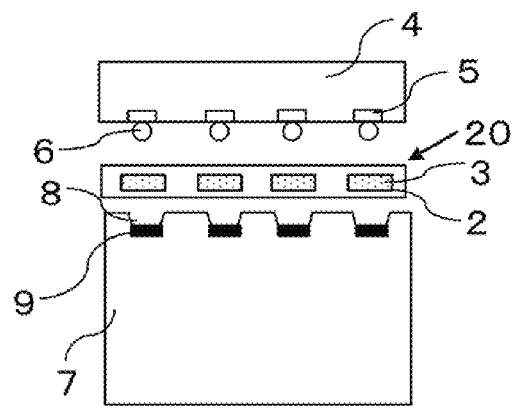
Figure 3C:
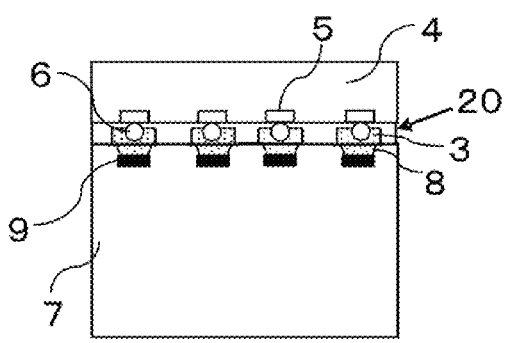

First, as shown in FIG. 3A, the circuit board 7 having the recesses 8 and the electrode pads 9 is manufactured. Needless to say, the layout of the recesses 8 and the electrode pads 9 should be adapted to the layout of the electrode bumps 6 of the IC package 4 that are to be mounted on the recesses 8 and the electrode pads 9.

Next, the bonding sheet 20 is placed on the upper surface of the circuit board 7 with the adhesive-filling portions 2 aligned to come right above their corresponding recesses 8. Then, the IC package 4 is set above the bonding sheet 20 with the electrode bumps 6 aligned to come right above their corresponding adhesive-filling portions 2 (see FIG. 3B).

Next, the IC package 4 is pressed to thrust the electrode bumps 6 into the bonding sheet 20 such that the electrode bumps 6 break through the adhesive-filling portions 2 and protrude from the lower surface of the bonding sheet 20 to be inserted into the recesses 8. At this time, the electrically conductive adhesive 3 that flows out from the adhesive-filling portions 2 flows into the recesses 8 to fill the gap between the electrode bumps 6 and the electrode pads 9 (see FIG. 3C).

Figure 3D:
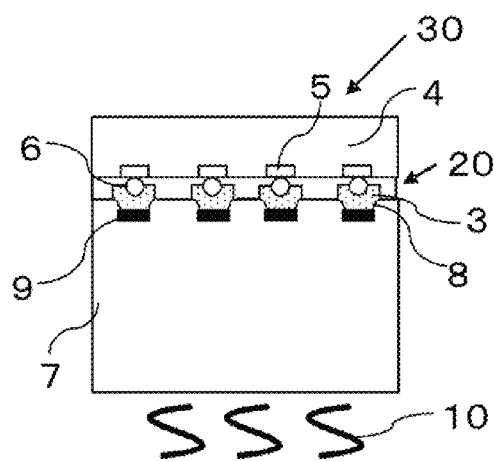

In a case where the electrically conductive adhesive 3 contains a thermosetting resin such as a polyimide resin, the circuit board 7 should be heated, after the electrically conductive adhesive 3 has flowed into the recesses 8, by an appropriate heat source 10 to harden the electrically conductive adhesive 3 (see FIG. 3D). In a case where the electrically conductive adhesive 3 contains a thermoplastic resin such as an EVA resin, the bonding sheet 20 should be heated, before being placed on the circuit board 7, to a temperature at which the electrically conductive adhesive 3 melts, and the electrically conductive adhesive 3 should later be hardened by cooling of the circuit board 7 after it has flowed into the recesses 8 with the adhesive-filling portions 2 broken through by the electrode bumps 6.

Since the solid content of the electrically conductive adhesive 3 filled in the adhesive-filling portions 2 is smaller than the cubic measure of the gap in the recesses 8 between the electrode bumps 6 and the electrode pads 9, the electronic circuit device 30 can be securely prevented against an overflow of the electrically conductive adhesive 3.

Since there is no need of forming a recess on the circumference of the electrode bumps 6, the electronic circuit device 30 is suitable for mass production with no complication in manufacturing the IC package 4.

The electronic component to which the present invention can be applied is not limited to an IC package. Needless to say, the present invention is also applicable in mounting various other electronic components such as a capacitor, a transistor, a diode, etc. on a circuit board.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

What is claimed is:

1. A bonding sheet, being to be disposed between an electronic component and a circuit board, for fixing the electronic component on the circuit board via the bonding sheet, and for electrically connecting terminal electrodes of the electronic component to respective electrode pads of the circuit board via the bonding sheet, the bonding sheet comprising:

an insulating sheet enclosing cavities to be faced with the respective terminal electrodes of the electronic component, wherein portions of the upper surface of the insulating sheet are directly above the cavities and portions of the lower surface of the insulating sheet are directly below the cavities, and the portions of the upper surface and the portions of the lower surface are penetrable through from one to the other by an electrode bump, and adhesive-filling portions made of electrically conductive adhesive which fills the respective cavities.

2. The bonding sheet according to claim 1 wherein the insulating sheet is made of elastic material.

3. The bonding sheet according to claim 2 wherein the insulating sheet is made of rubber.

4. The bonding sheet according to claim 1 wherein the electrically conductive adhesive is a mixture of adhesive resin and conducting particles.

5. The bonding sheet according to claim 4 wherein the adhesive resin is thermosetting resin.

6. The bonding sheet according to claim 4 wherein the adhesive resin is thermoplastic resin.

7. An electronic circuit device, comprising:

an electronic component;

a circuit board; and the bonding sheet according to claim 1, which is disposed between the electronic component and the circuit board, the electronic component being fixed on the circuit board via the bonding sheet, and the terminal electrodes of the electronic component being electrically connected to respective electrode pads of the circuit board via the bonding sheet, wherein each of the terminal electrodes of the electronic component comprises an electrode bump, the electrode bumps pass through the bonding sheet from one surface to other surface thereof via the respective adhesive-filling portion and protrude from the other surface of the bonding sheet, and the electrode bumps and the respective electrode pads are electrically connected with the electrically conductive adhesive that flows out from the respective adhesive-filling portions.

8. The electronic circuit device according to claim 7, wherein the circuit board comprises recesses being laid out thereon independently from each other in one to one correspondence to the electrode pads, and the electrode pads are in the respective recesses, each recess is filled at least partially with the electrically conductive adhesive that flows out from the adhesive-filling portion passed by the electrode bump.

9. The electronic circuit device according to claim 8, wherein the cubic volume of each adhesive-filling portion is smaller than the difference between cubic capacity of the respective recess and cubic capacity of the portion of the respective electrode bump being located inside the respective recess.

10. A method of manufacturing an electronic circuit device including an electronic component, a circuit board and the bonding sheet according to claim 1, which is disposed between the electronic component and the circuit board, the electronic component being fixed on the circuit board via the bonding sheet, and terminal electrodes of the electronic component being electrically connected to respective electrode pads of the circuit board via the bonding sheet, comprising:

placing the bonding sheet on the circuit board as aligning the adhesive-filling portions of the bonding sheet to face the respective electrode pads in the circuit board;

placing the electronic component on the bonding sheet as aligning the terminal electrodes of the electronic component to face the respective adhesive-filling portions of the bonding sheet;

electrically connecting the terminal electrodes and the respective electrode pads via the electrically conductive adhesive that flows out from the respective adhesive-filling portions by the terminal electrodes passing through the bonding sheet to tear the respective adhesive-filling portions; and fixing the terminal electrodes and the respective electrode pads by solidifying the flowed electrically conductive adhesive.

11. The method of manufacturing an electronic circuit device according to claim 10, wherein recesses being laid out on the circuit board independently from each other in one to one correspondence to the electrode pads, the electrode pads are formed on the bottom of the respective recesses, and the electrically conductive adhesive flowed in the step of electrically connecting are kept within the recesses.

12. The method of manufacturing an electronic circuit device according to claim 10, wherein the electrically conductive adhesive contains thermosetting resin, the thermosetting resin is uncured before the step of electrically connecting is performed, the thermosetting resin flows out by the terminal electrodes passing through the adhesive-filling portions at the step of electrically connecting, and the step of solidifying includes a step of heating and curing the flowed thermosetting resin to fix the terminal electrodes to the respective electrode pads.

13. The method of manufacturing an electronic circuit device according to claim 10, wherein the electrically conductive adhesive contains thermoplastic resin, the method comprises a step of heating the bonding sheet to liquidize the thermoplastic resin before the step of placing the bonding sheet is performed, the thermoplastic resin flows out by the terminal electrodes passing through the adhesive-filling portions at the step of electrically connecting, and the step of solidifying includes a step of cooling and curing the flowed thermoplastic resin to fix the terminal electrodes to the respective electrode pads.

14. A bonding sheet, being to be disposed between an electronic component and a circuit board, for fixing the electronic component on the circuit board via the bonding sheet, and for electrically connecting terminal electrodes of the electronic component to respective electrode pads of the circuit board via the bonding sheet, the bonding sheet comprising:

an insulating sheet means having a plurality of encompassing means enclosing cavities to be faced with the respective terminal electrodes of the electronic component, upper and lower surfaces of the plurality of the encompassing means directly above and directly below the cavities being penetrable through from one surface of the bonding sheet to other surface by an electrode bump, and adhesive means made of electrically conductive adhesive for filling the respective encompassing means.

15. An electronic circuit device, comprising:

an electronic component;

a circuit board; and the bonding sheet according to claim 1, which is disposed between the electronic component and the circuit board, the electronic component being fixed on the circuit board via the bonding sheet, and the terminal electrodes of the electronic component being electrically connected to respective electrode pads of the circuit board via the bonding sheet, wherein each of the terminal electrodes of the electronic component having an electrode bump, the electrode bumps pass through the bonding sheet from one surface to other surface thereof via the respective adhesive means and protrude from the other surface of the bonding sheet, and the electrode bumps and the respective electrode pads are electrically connected with the electrically conductive adhesive that flows out from the respective adhesive means.

* * * * *